(12) United States Patent
Fukuda et al.

(10) Patent No.: US 11,698,312 B2
(45) Date of Patent: Jul. 11, 2023

(54) TORQUE LOAD MEMBER AND METHOD FOR MANUFACTURING SAME, AND TORQUE MEASURING DEVICE

(71) Applicants: NSK LTD., Tokyo (JP); Proterial, Ltd., Tokyo (JP)

(72) Inventors: Kota Fukuda, Shizuoka (JP); Junji Ono, Kanagawa (JP); Shinji Okada, Shizuoka (JP); Teruyuki Nakamura, Tokyo (JP); Yuta Sugiyama, Tokyo (JP)

(73) Assignees: NSK LTD., Tokyo (JP); PROTERIAL, LTD., Tokyo (JP)

( * ) Notice: Subject to any disclaimer, the term of this patent is extended or adjusted under 35 U.S.C. 154(b) by 0 days.

(21) Appl. No.: 17/488,494

(22) Filed: Sep. 29, 2021

(65) Prior Publication Data
US 2022/0099505 A1    Mar. 31, 2022

(30) Foreign Application Priority Data
Sep. 30, 2020    (JP) ................... 2020-164642

(51) Int. Cl.
*G01L 3/10*    (2006.01)
*H10N 35/00*   (2023.01)

(52) U.S. Cl.
CPC ........... *G01L 3/102* (2013.01); *H10N 35/101* (2023.02)

(58) Field of Classification Search
CPC ..... H04L 63/062; H04L 63/083; H04L 63/20; H04L 2463/062; H04L 67/306; H04L 67/34; G07C 9/00174; G07C 2009/00769; H04W 12/03; H04W 12/35; H04W 12/04; H04W 4/40; H04W 4/50; H04W 12/069; H04W 12/08
See application file for complete search history.

(56) References Cited

U.S. PATENT DOCUMENTS

| 5,205,145 | A | * | 4/1993 | Ishino | ..................... G01L 3/103 29/90.7 |
| 5,595,613 | A | * | 1/1997 | Hatano | ..................... C23C 8/32 148/319 |
| 2005/0117825 | A1 | * | 6/2005 | Goto | ..................... G01P 3/446 384/448 |
| 2005/0204830 | A1 | * | 9/2005 | Kuroda | ..................... G01L 3/102 73/862.331 |

FOREIGN PATENT DOCUMENTS

| JP | 2017-096825 A | 6/2017 |
| JP | 2017-096826 A | 6/2017 |

* cited by examiner

*Primary Examiner* — Freddie Kirkland, III
(74) *Attorney, Agent, or Firm* — Sughrue Mion, PLLC

(57) ABSTRACT

A torque load member has a detected surface which is configured to face a magnetostrictive torque sensor. The detected surface is a shot peened surface whose magnetic anisotropy directed in a specific direction has been reduced by performing shot peening thereto at an arc height value of 0.31 mmA or more.

4 Claims, 7 Drawing Sheets

TORQUE LOAD MEMBER AND METHOD FOR MANUFACTURING SAME, AND TORQUE MEASURING DEVICE

TECHNICAL FIELD

The present invention relates to a torque load member to which torque is loaded during use and which is used for measuring the torque, a method for manufacturing the same, and a torque measuring device.

BACKGROUND ART

In recent years, in the field of automobiles, the development of a system in which a torque transmitted by a rotating shaft of a power train (power transmission mechanism) is measured, and the measurement result is used for controlling output of a power source such as an engine and an electric motor, and controlling gear shifting of a transmission, has been progressing.

As a device of measuring a torque transmitted by a torque load member such as a rotating shaft, a magnetostrictive torque measuring device is known (for example, see JP 2017-096825(A) and JP 2017-096826(A)). The magnetostrictive torque measuring device measures a torque by utilizing a phenomenon (reverse magnetostrictive effect) where magnetic permeability of the torque load member varies according to the torque loaded. Specifically, by facing a coil to a detected surface of the torque load member, and exciting the coil with an alternating current, a magnetic flux is generated around the coil and passes through a surface layer portion of the detected surface. Then, a torque loaded to the torque load member is measured as a change of the magnetic permeability of the surface layer portion of the detected surface, that is, a change of the self-inductance of the coil. A torque sensor including such a coil is referred to as a magnetostrictive torque sensor.

CITATION LIST

Patent Literature

[Patent Literature 1] JP 2017-096825(A)
[Patent Literature 2] JP 2017-096826(A)

SUMMARY OF INVENTION

Technical Problem

The magnetostrictive torque measuring device has a problem such that sensitivity in torque measurement is deteriorated when the detected surface has a high magnetic anisotropy directed in a specific direction, specifically, when a degree to which magnetization directions of magnetic domains existing in the detected surface are aligned in a specific direction is large, or when defects such as flaws exist in the detected surface.

In view of the circumstances described above, an object of the present invention is to achieve a structure of a torque load member capable of enhancing sensitivity in torque measurement.

Solution to Problem

A torque load member of one aspect of the present invention has a detected surface configured to face a magnetostrictive torque sensor.

The detected surface is a shot peening treated surface whose magnetic anisotropy directed in a specific direction has been reduced by performing shot peening thereto at an arc height value of 0.31 mmA or more.

The arc height value is an index of a processing degree of shot peening, which is obtained by performing shot peening to a test piece configured by a special steel strip molded into a specified size and shape, and then measuring the amount of curvature (mm) of the shot peened test piece. The unit of the arc height value is represented by "mmA". The measurement of the arc height value is carried out by using an A piece based on "JIS B 2711:2013". Accordingly, by performing shot peening to A pieces under various conditions (material, shape and size of projection materials, tank (air) pressure, coverage, and the like), and then measuring the arc height values of the shot peened A pieces in advance, when shot peening is performed to the detected surface of the torque load member under the above condition, the arc height value corresponding to the condition is regarded as the processing degree of the shot peening.

A torque measuring device of one aspect of the present invention includes a torque load member having a detected surface, and a magnetostrictive torque sensor that faces the detected surface. The torque load member is the torque load member of one aspect of the present invention.

The torque measuring device of one aspect of the present invention further includes a rolling bearing by which the torque load member is rotatably supported, and by which the torque sensor is supported. In this case, the torque sensor may be supported, for example, by a stationary ring of the rolling bearing, which does not rotate during use, directly or indirectly through another member such as a sensor holder.

A torque load member which is targeted for manufacturing method of one aspect of the present invention has a detected surface that faces a magnetostrictive torque sensor. Particularly, the method of one aspect of the present invention for manufacturing a torque load member includes a step of performing shot peening to the detected surface at an arc height value of 0.31 mmA or more so as to reduce magnetic anisotropy directed in a specific direction of the detected surface.

Effect of Invention

According to one aspect of the present invention, a torque load member capable of enhancing sensitivity in torque measurement, a method for manufacturing the same, and a torque measuring device are provided.

DESCRIPTION OF EMBODIMENTS

An example of an embodiment of the present invention will be described with reference to FIGS. 1 to 5.

Figure 1:
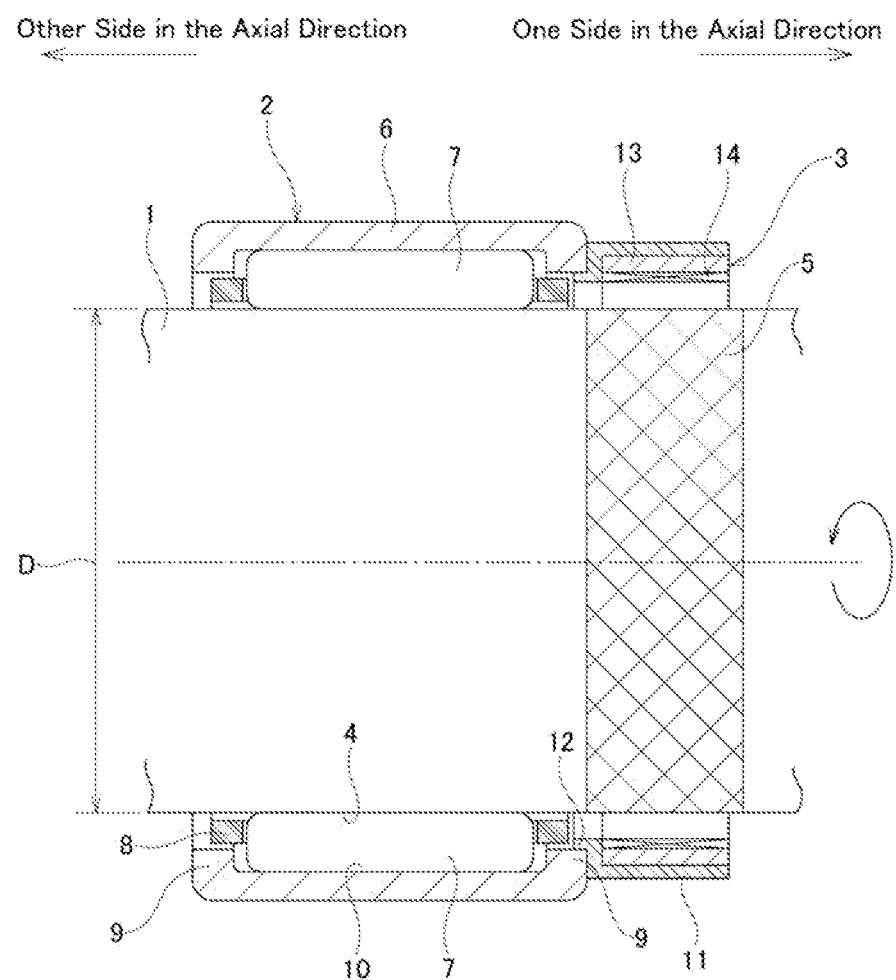
FIG. 1 is a cross-sectional view of a torque measuring device of an example of an embodiment of the present invention.

FIG. 1 illustrates a torque measuring device. This torque measuring device includes a rotating shaft 1 that corresponds to a torque load member, a rolling bearing 2, and a magnetostrictive torque sensor 3.

In the following description in relation to this example, with respect to the torque measuring device, one side in the axial direction is a right side in FIG. 1, and the other side in the axial direction is a left side in FIG. 1.

The rotary shaft 1 is a torque transmission shaft of a power train of an automobile such as a rotating shaft of a transmission, a rotating shaft of a differential gear, a propeller shaft, and a drive shaft. The rotating shaft 1 is made of steel (iron alloy), which is a material having magnetostrictive characteristics, such as SCr420 (chrome steel), SCM420 (chrome molybdenum steel), and SNCM420 (nickel chrome molybdenum steel), and is formed in a columnar or cylindrical shape.

The rotating shaft 1 has an inner raceway 4 having a cylindrical surface shape on the outer circumferential surface of a portion in the axial direction thereof. The rotating shaft 1 has a detected surface 5 having a cylindrical surface shape on a portion of the outer circumferential surface adjacent to the one side in the axial direction of the inner raceway 4 (a portion to which an oblique lattice is applied in FIGS. 1, 2A and 2B).

The method for manufacturing the rotating shaft 1 has steps of subjecting the outer circumferential surface to a heat treatment such as a carburization treatment, and then performing shot peening to the detected surface 5 at the arc height value of 0.31 mmA or more so as to reduce magnetic anisotropy directed in a specific direction of the detected surface 5. That is, the detected surface 5 is a shot peened surface whose magnetic anisotropy directed in a specific direction has been reduced by performing such shot peening.

Specifically, by subjecting the detected surface 5 to the shot peening as described above, magnetic domains of a surface layer portion [a portion from the surface to a specified depth (for example, a depth of several μm to ten and several μm)] of the detected surface 5 are made finer (fractured into more pieces), and thus a degree to which magnetization directions of magnetic domains existing in the detected surface are aligned in a specific direction becomes sufficiently small. As a result, magnetic anisotropy in the surface layer portion of the detected surface 5 is sufficiently reduced.

In addition, by performing the shot peening, defects such as flaws in the surface layer portion of the detected surface 5 are (partially or wholly) removed. Also due to this, in the surface layer portion of the detected surface 5, magnetic anisotropy directed in a specific direction is sufficiently reduced. Note that defects such as flaws in the surface layer portion of the detected surface 5 are not limited to scratches on the surface, and include cracks under the surface, and the like. In this example, in a case where the defects are scratches on the surface, the scratches are (partially or wholly) removed as the surface is plastically processed into a fine uneven shape by the shot peening. In a case where the defects are cracks under the surface, the cracks are (partially or wholly) removed as the surface layer portion is compressed by the shot peening.

The rotating shaft 1 is rotatably supported, by the rolling bearing 2, to a stationary member, which does not rotate during use, such as a housing of the power train of an automobile.

The rolling bearing 2 is a needle bearing, and includes an outer ring 6 which is a stationary ring that does not rotate during use, a plurality of needles 7, and a retainer 8.

The outer ring 6 is made of steel such as bearing steel, and formed in a cylindrical shape. The outer ring 6 has inward flanges 9 in the end portions on both sides in the axial direction thereof, which are bent toward the inner side in the radial direction. The outer ring 6 has an outer raceway 10 having a cylindrical surface shape on the inner circumferential surface of the intermediate portion in the axial direction sandwiched by a pair of the inward flanges 9.

The plurality of needles 7 are respectively made of steel such as bearing steel, and formed in a columnar shape. These needles 7 are arranged between the outer raceway 10 and the inner raceway 4 so as to be able to roll freely. The retainer 8 is made of steel or a synthetic resin, and is formed in a cylindrical shape. The retainer 8 has pockets in plural locations in the circumferential direction thereof, and each of the needles 7 is held inside each of these pockets so as to be able to roll freely.

The torque sensor 3 is supported by the outer ring 6 through a sensor holder 11. The sensor holder 11 is made of metal, a synthetic resin or the like, and is formed in a cylindrical shape. The sensor holder 11 is attached to the outer ring 6 so as to be arranged adjacent to the one side in the axial direction of the outer ring 6. Specifically, a fitting cylinder portion 12 provided in the end portion on the other side in the axial direction of the sensor holder 11 is internally fitted and fixed in the inward flange 9 provided in the one side in the axial direction of the outer ring 6. However, the sensor holder 11 may be integrally formed with the outer ring 6.

The torque sensor 3 includes a back yoke 13 which is made of magnetic material and has a cylindrical shape, and a detection part 14 held in the inner side in the radial direction of the back yoke 13. The torque sensor 3 is internally fitted to and held by the sensor holder 11 in a state where the torque sensor 3 is arranged around the detected surface 5 of the rotating shaft 1 so as to be coaxial with the detected surface 5, that is, in a state where the detection part 14 faces the detected surface 5.

Figure 2B:
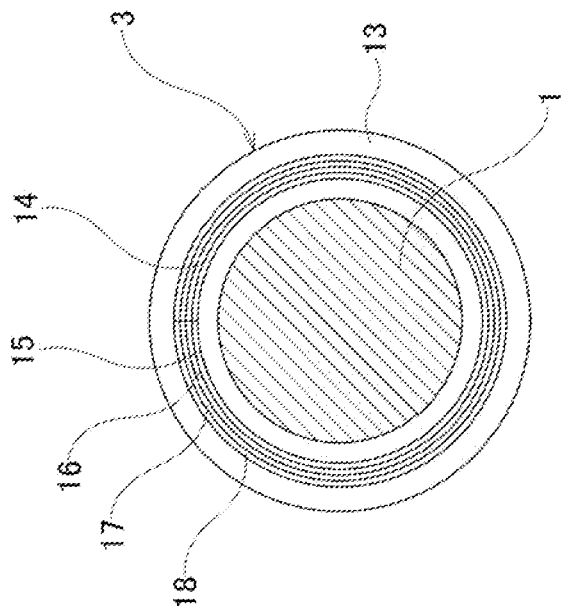
FIG. 2B is a view of the rotating shaft and the torque sensor as viewed from the axial direction.

As illustrated in FIG. 2B, the detection part 14 includes a first coil layer 15, a second coil layer 16, a third coil layer 17, and a fourth coil layer 18, which are four coil layers each formed in a cylindrical shape. These coil layers 15 to 18 are arranged so as to be laminated in this order from the inner side in the radial direction. The first coil layer 15 and the second coil layer 16 are formed in a cylindrical shape by respectively forming on one side surface and the other side surface of a belt-shaped flexible board (not illustrated), and rounding the flexible board into a cylindrical shape. The third coil layer 17 and the fourth coil layer 18 are formed in a cylindrical shape by respectively forming on one side surface and the other side surface of another belt-shaped flexible board (not illustrated), and rounding the flexible board into a cylindrical shape. An insulation layer (not illustrated) is provided between the second coil layer 16 and the third coil layer 17.

Figure 3:
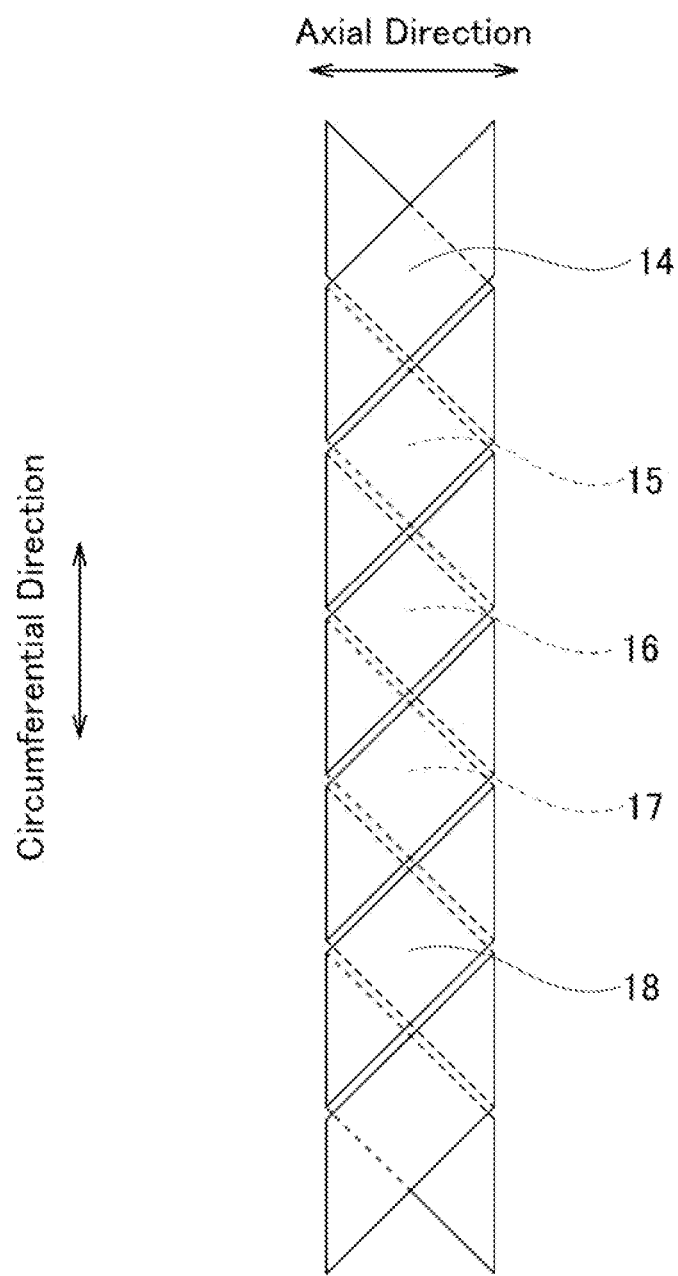
FIG. 3 is a developed view of a first coil layer to a fourth coil layer of a detection part of the torque sensor as viewed from the outer side in the radial direction.
Figure 4:
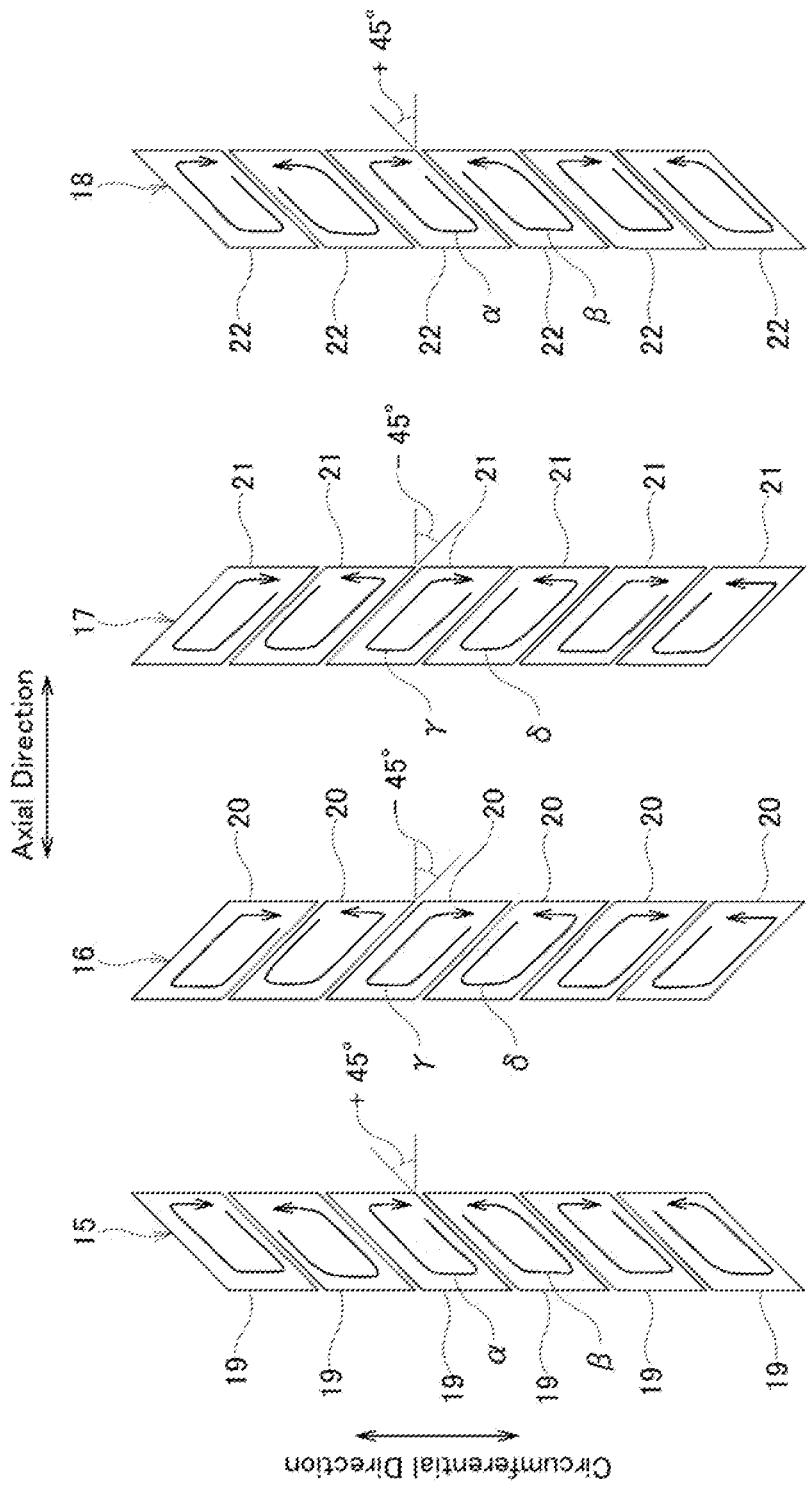
FIGS. 4A to 4D are developed views of the first coil layer to the fourth coil layer of the detection part of the torque sensor as viewed respectively in the single body state from the outer side in the radial direction.

FIG. 3 illustrates a developed view of the detection part 14 as viewed from the outer side in the radial direction. FIGS. 4A to 4D illustrate developed views of the first coil layer 15 to the fourth coil layer 18 of the detection part 14 as viewed respectively from the outer side in the radial direction.

As illustrated in FIG. 4A, the first coil layer 15 includes a plurality of first detecting coils 19. The first detecting coils 19 are arranged at equal pitches in the circumferential direction. The ones adjacent to each other in the circumferential direction of the first detecting coils 19 (except for the ones adjacent to each other sandwiching both end edges of the flexible board on which the first coil layer 15 is formed) are connected in series.

As illustrated in FIG. 4B, the second coil layer 16 includes a plurality of second detecting coils 20. The second detecting coils 20 are arranged at equal pitches in the circumferential direction. The ones adjacent to each other in the circumferential direction of the second detecting coils 20 (except for the ones adjacent to each other sandwiching both end edges of the flexible board on which the second coil layer 16 is formed) are connected in series.

As illustrated in FIG. 4C, the third coil layer 17 includes a plurality of third detecting coils 21. The third detecting coils 21 are arranged at equal pitches in the circumferential direction. The ones adjacent to each other in the circumferential direction of the third detecting coils 21 (except for the ones adjacent to each other sandwiching both end edges of the flexible board on which the third coil layer 17 is formed) are connected in series.

As illustrated in FIG. 4D, the fourth coil layer 18 includes a plurality of fourth detecting coils 22. The fourth detecting coils 22 are arranged at equal pitches in the circumferential direction. The ones adjacent to each other in the circumferential direction of the fourth detecting coils 22 (except for the ones adjacent to each other sandwiching both end edges of the flexible board on which the fourth coil layer 18 is formed) are connected in series.

The first detecting coils 19 and the fourth detecting coils 22 respectively include coil lines on both side portions in the circumferential direction thereof, which are inclined at +45 degrees to the axial direction of the rotating shaft 1. On the other hand, the second detecting coils 20 and the third detecting coils 21 respectively include coil lines on both side portions in the circumferential direction thereof, which are inclined at −45 degrees to the axial direction of the rotating shaft 1.

In this example, the first coil layer 15 to the fourth coil layer 18 are respectively formed on the side surfaces of the flexible boards. However, the first coil layer 15 to the fourth coil layer 18 may be respectively formed by winding a lead wire around a support member such as a bobbin.

Figure 5:
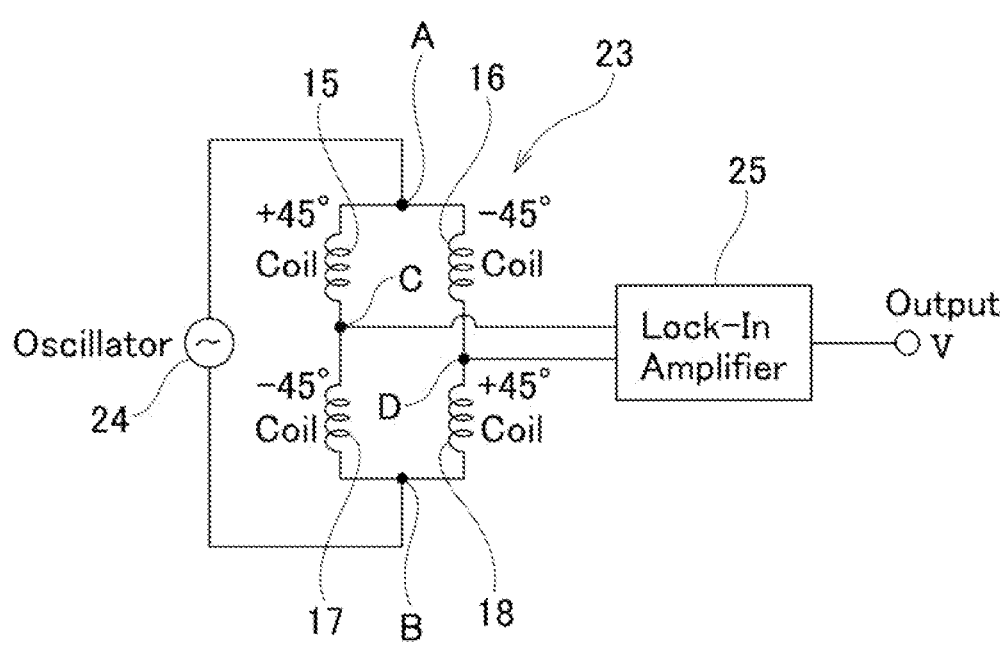
FIG. 5 is a view illustrating a bridge circuit configured by including the first coil layer to the fourth coil layer of the detection part of the torque sensor.

As illustrated in FIG. 5, these coil layers 15 to 18 constitute a bridge circuit 23. The bridge circuit 23 includes, as well as the first coil layer 15 to the fourth coil layer 18, an oscillator 24 for applying an AC voltage to between a point A and a point B, and a lock-in amplifier 25 for detecting and amplifying an electric potential difference (middle point voltage, differential voltage) between a point C and a point D.

When using the torque measuring device of this example, an AC voltage is applied to between the point A and the point B of the bridge circuit 23 with the oscillator 24, so as to cause an AC current to flow into the first coil layer 15 to the fourth coil layer 18. Then, in these coil layers 15 to 18, as indicated by arrows α, β, γ, δ in FIGS. 4A to 4D, currents directed in directions opposite to each other flow in the detect coils adjacent to each other in the circumferential direction. In other words, the detect coils of these coil layers 15 to 18 are wound so that currents directed to such directions flow. As a result, an AC magnetic field is generated around these coil layers 15 to 18, and a part of the magnetic flux of this AC magnetic field passes through the surface layer portion of the detected surface 5 of the rotating shaft 1.

Figure 2A:
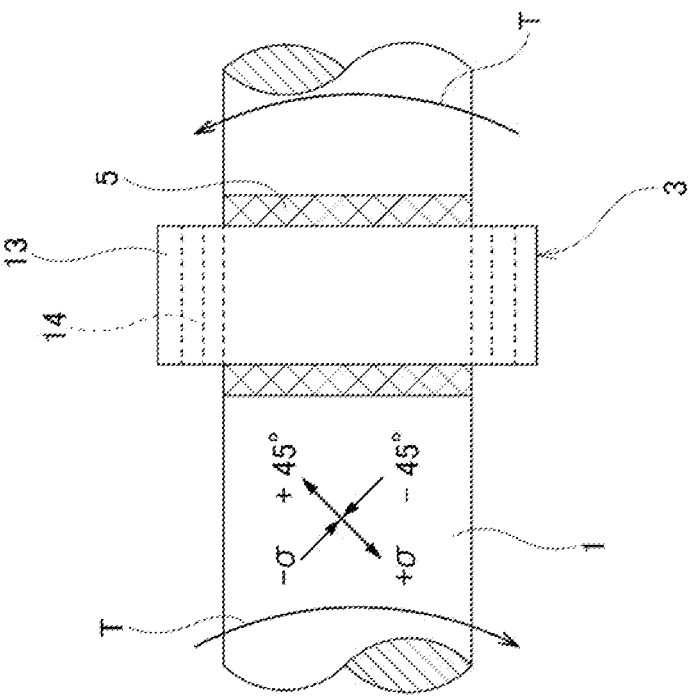
FIG. 2A is a view of a rotating shaft and a torque sensor of the torque measuring device illustrated in FIG. 1 as viewed from the outer side in the radial direction.

In this state, when a torque T is applied to the rotating shaft 1 in the direction indicated in FIG. 2A, the rotating shaft 1 receives a tensile stress ($+\sigma$) in a direction of +45 degrees with respect to the axial direction and a compressive stress ($-\sigma$) in a direction of −45 degrees with respect to the axial direction. Then, due to a reverse magnetostrictive effect, magnetic permeability of the rotating shaft 1 is increased in the direction of +45 degrees where the tensile stress ($+\sigma$) acts, and magnetic permeability of the rotating shaft 1 is reduced in the direction of −45 degrees where the compressive stress ($-\sigma$) acts.

On the other hand, the first coil layer 15 and the fourth coil layer 18 include the coil lines inclined at +45 degrees to the axial direction of the rotating shaft 1, a part of the magnetic flux of the AC magnetic field generated around the coil lines passes through the surface layer portion of the detected surface 5 of the rotating shaft 1 in a direction of −45 degrees where magnetic permeability is reduced. Therefore, the inductances of the first coil layer 15 and the fourth coil layer 18 are respectively reduced. The second coil layer 16 and the third coil layer 17 include the coil lines inclined at −45 degrees to the axial direction of the rotating shaft 1, a part of the magnetic flux of the AC magnetic field generated around the coil lines passes through the surface layer portion of the detected surface 5 of the rotating shaft 1 in a direction of +45 degrees where magnetic permeability is increased. Therefore, the inductances of the second coil layer 16 and the third coil layer 17 are respectively increased.

On the other hand, when a torque T is applied to the rotating shaft 1 in a direction opposite to the direction indicated in FIG. 2A, due to an effect opposite to that in the case described above, the inductances of the first coil layer 15 and the fourth coil layer 18 are increased, and the inductances of the second coil layer 16 and the third coil layer 17 are reduced.

In the Bridge circuit 23, by detecting and amplifying the electric potential difference (middle point voltage, differential voltage) between the point C and the point D with the lock-in amplifier 25, an output V corresponding to the direction and magnitude of the torque T loaded to the rotating shaft 1 is obtained. Therefore, by examining a relation between the output V and the torque T in advance, the direction and magnitude of the torque T can be calculated from the output V.

In this example, the detected surface 5, which is a portion of the outer circumferential surface of the rotating shaft 1 to face the detection part 14 of the torque sensor 3, is a shot peened surface to which the shot peening has been performed at the arc height value of 0.31 mmA or more. Furthermore, by performing the shot peening to the detected surface 5, the magnetic domains of the surface layer portion of the detected surface 5 are made finer (fractured into more pieces), and defects such as flaws in the surface layer portion of the detected surface 5 are (partially or wholly) removed. Due to this, a degree to which magnetization directions of magnetic domains existing in the detected surface are aligned in a specific direction becomes small, and thus magnetic anisotropy directed in a specific direction in the surface layer portion of the detected surface 5 is sufficiently reduced. Therefore, sensitivity in torque measurement can be enhanced. The arc height value is preferably 0.40 mmA or more, more preferably 0.45 mmA or more.

That is, when magnetic domains existing in the surface layer portion of the detected surface 5 is large, and a degree to which magnetization directions of these magnetic domains are aligned in a specific direction is large, magnetic domain walls existing on the boundaries between the magnetic domains are hard to move with respect to external excitation (passage of a magnetic flux generated around the detection part 14) accordingly. Furthermore, when defects such as flaws exist in the surface layer portion of the detected surface 5, the magnetic domain walls are hard to move with respect to external excitation because the magnetic domain walls are obstructed by the defects. When the magnetic domain walls are hard to move with respect to external excitation in this way, the torque applied to the rotating shaft 1 becomes unable to be measured with high sensitivity as a change in the magnetic permeability of the detected surface 5 by the torque sensor 3 accordingly.

On the other hand, in the structure of this example, because the magnetic domains existing in the surface layer portion of the detected surface 5 are made finer (fractured into more pieces), and thus a degree to which magnetization directions of magnetic domains existing in the detected surface are aligned in a specific direction becomes small, thereby sufficiently reducing the magnetic anisotropy, the magnetic domain walls are easy to move (less likely to be obstructed by the defects because the movement distance of the magnetic domain walls can be made short) with respect to external excitation accordingly. Furthermore, because defects such as flaws in the surface layer portion of the detected surface 5 are (partially or wholly) removed, and thus magnetic anisotropy directed in a specific direction is sufficiently reduced, troubles caused by the defects are (partially or wholly) eliminated, and thus the magnetic domain walls are easy to move with respect to external excitation. Therefore, in this example, the magnetic domain walls move with high response to external excitation. As a result, the torque applied to the rotating shaft 1 is able to be measured with high sensitivity as a change in the magnetic permeability of the detected surface 5 by the torque sensor 3.

The characteristics of the torque measuring device of this example which includes the rotating shaft 1 and the torque sensor 3 can be evaluated, for example, with the following sensitivity and hysteresis in torque measurement. That is, the bridge circuit 23, which includes the first coil layer 15 to the fourth coil layer 18, the oscillator 24 for applying an AC voltage to between the point A and the point B, and the lock-in amplifier 25 for detecting and amplifying an electric potential difference (middle point voltage, differential voltage) between the point C and the point D, is formed. By applying an AC voltage to between the point A and the point B of the bridge circuit 23, an AC magnetic field is generated around the first coil layer 15 to the fourth coil layer 18, and thus the magnetic flux of this AC magnetic field passes through the surface layer portion (a range from the surface to a depth D) of the detected surface (for example, the depth D is about 300 μm to 500 μm). In this state, while a torque loaded to the rotating shaft 1 is changed so as to reciprocate between positive and negative rated torques ($T_1$, $T_2$), the torque is measured to obtain characteristics data with respect to the torque measurement. From the characteristics data, sensitivity and hysteresis in torque measurement, which are defined as follows, can be obtained.

$$\text{Sensitivity (mV/Nm)} = \alpha/\gamma = |A_1 - A_2|/|T_1 - T_2|$$

$$\text{Hysteresis (\% } FS) = \beta/\gamma = |a_1 - a_2|/|T_1 - T_2|$$

In the torque measuring device of the present invention, for example, the sensitivity in torque measurement is preferably 4.17 mV/Nm or more, more preferably 4.40 mV/Nm or more, and further preferably 5.13 mV/Nm or more. The hysteresis is preferably 2.02% FS or less, more preferably 1.10% FS or less, and further preferably 0.89% FS or less.

A torque load member that is an object of the present invention is not limited to a rotating shaft, and may be, for example, a sleeve which is externally fitted and fixed to a rotating shaft, and to which a torque is loaded together with the rotating shaft.

The torque load member is not limited to a member having a detected surface on the circumferential surface, and may be, for example, a member having a detected surface on the side surface in the axial direction, as described in JP 2017-96825(A) and JP 2017-96826(A).

When the torque load member that is an object of the present invention is incorporated in the power train of an automobile, the targeted device is not particularly limited. For example, a transmission where shifting is done by vehicle-side control such as a manual transmission (MT), an automatic transmission (AT), a belt type continuously variable transmission, a toroidal type continuously variable transmission, an automatic manual transmission (AMT), dual clutch transmission (DCT) and the like, or a transfer can be targeted. A drive system (FF, FR, MR, RR, 4WD and the like) of the targeted vehicle is also not particularly limited.

The torque load member that is an object of the present invention is not limited to the rotating shaft of the power train of an automobile, may also adopt rotating shafts of various mechanical devices such as a rotating shaft of a windmill (main shaft, rotating shaft of a speed increaser), a roll neck of a rolling mill, a rotating shaft of a railway vehicle (axle, rotating shaft of a speed reducer), a rotating shaft of a machine tool (main shaft, rotating shaft of a feed system), rotating shafts of a construction machine, an agricultural machine, a household electric appliance, and an motor, a rotating shaft of a power steering device, and a rotating shaft of a power assist suit.

When embodying the torque measuring device of the present invention, the torque sensor is not limited to be supported by a rolling bearing, and may be supported by another member such as a housing.

When embodying the torque measuring device of the present invention, in a case where the structure in which the torque sensor is supported by the rolling bearing is adopted, the rolling bearing is not limited to a needle bearing, and may be other types of rolling bearings such as a ball bearing, a roller bearing, a tapered roller bearing, and the like.

When embodying the torque measuring device of the present invention, the magnetostrictive torque sensor is not limited to the one in the embodiment described above, and may also adopt various known magnetostrictive torque sensors as described in JP 2017-096825(A), JP 2017-096826 (A), and the like.

EXAMPLE

Examples conducted for confirming the effect of the present invention will be described.

In the examples, a plurality of rotating shafts (Examples 1 to 5, Comparative Examples 1 to 5) were prepared as a sample. These rotating shafts respectively had a detected surface, to some of which shot peening had been performed on a portion in the axial direction of the outer circumferential surface, and had mutually different conditions of the shot peening and the like. Then, by facing the torque sensor 3 to the detected surface of each of these rotating shafts (see FIGS. 1, 2A and 2B), the torque loaded was measured.

[Regarding Samples]

The specifications of respective rotating shafts (Examples 1 to 5, Comparative Examples 1 to 5) are as described below:

Example 1

Shaft diameter D (see FIG. 1): 18 mm
Material: SCr420H
Treatment: the outer circumferential surface was subjected to heat treatment, and then the detected surface was subjected to shot peening.
Conditions of the heat treatment:
  carburization (950° C., 5 hours, carbon potential 1.25%)
  tempering (175° C., 1 hour)
  quenching (820° C., 1 hour)
  tempering (240° C., 2 hours)
Conditions of the shot peening:
  projection materials . . . steel (spherical)
  diameter of projection materials . . . 0.6 mm
  hardness of projection materials . . . Hv700
  tank (air) pressure . . . 0.3 MPa
  coverage . . . 300%
  arc height value . . . 0.31 mmA

Example 2

The conditions were the same as in Example 1 except that the tank pressure was 0.5 MPa and the arc height value was 0.45 mmA in the shot peening.

Example 3

The conditions were the same as in Example 1 except that the carbon potential was 0.70% and the temperature of the tempering after the quenching was 175° C. in the carburization treatment, and that the tank pressure was 0.5 MPa and the arc height value was 0.45 mmA in the shot peening.

Example 4

The conditions were the same as in Example 1 except that the temperature of the tempering after the quenching was 175° C. in the carburization treatment.

Example 5

The conditions were the same as in Example 1 except that the temperature of the tempering after the quenching was 175° C. in the carburization treatment, and that the tank pressure was 0.5 MPa and the arc height value was 0.45 mmA in the shot peening.

Comparative Example 1

The conditions were the same as in Example 1 except that the shot peening was omitted.

Comparative Example 2

The conditions were the same as in Example 2 except that the diameter of the projection materials was 0.05 mm, the tank pressure was 0.5 MPa and the arc height value was 0.08 mmA in the shot peening.

Comparative Example 3

The conditions were the same as in Example 3 except that the shot peening was omitted.

Comparative Example 4

The conditions were the same as in Example 4 except that the shot peening was omitted.

Comparative Example 5

The conditions were the same as in Example 5 except that the diameter of the projection materials was 0.05 mm and the arc height value was 0.08 mmA in the shot peening.

The presence or absence of the shot peening, and the arc height value in the shot peening with respect to respective rotating shafts (Examples 1 to 5, Comparative Examples 1 to 5) are collectively showed in Table 1. In Table 1, Example 1 is simply referred to as "E1", and Comparative Example 1 is simply referred to as "CE1". The same applies to other Examples and Comparative Examples.

TABLE 1

| | E1 | E2 | E3 | E4 | E5 | CE1 | CE2 | CE3 | CE4 | CE5 |
|---|---|---|---|---|---|---|---|---|---|---|
| Shot peening | Presence | Presence | Presence | Presence | Presence | Absence | Presence | Absence | Absence | Presence |
| Arc Height Value (mmA) | 0.31 | 0.45 | 0.45 | 0.31 | 0.45 | — | 0.08 | — | — | 0.08 |

[Evaluation of Sensitivity and Hysteresis in Torque Measurement]

A torque loaded to each rotating shaft (Examples 1 to 5, Comparative Examples 1 to 5) was measured with the torque sensor 3 facing the detected surface.

Figure 6:
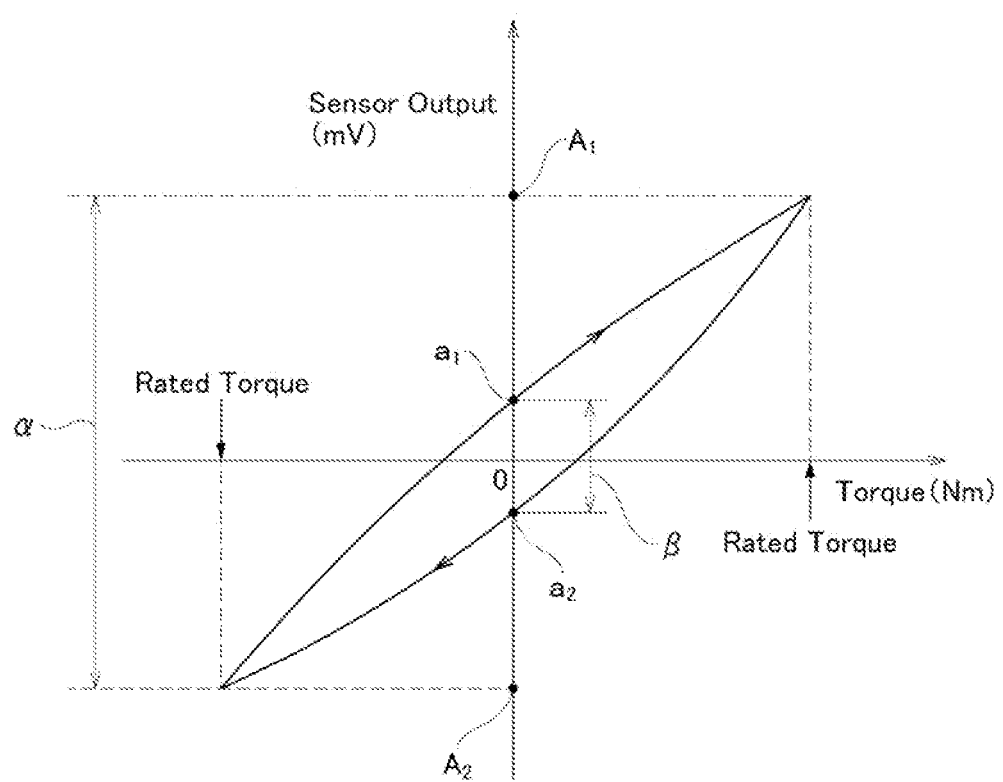
FIG. 6 is a diagram showing a relation between a torque and a sensor output.

Specifically, by applying an AC voltage to between the point A and the point B of the bridge circuit 23 with the oscillator 24 illustrated in FIG. 5, an AC magnetic field was generated around the first coil layer 15 to the fourth coil layer 18, so that the magnetic flux of this AC magnetic field passed through the surface layer portion (a range from the surface to a depth D) of the detected surface (the depth D was about 300 μm to 500 μm in this case according to calculation of a general skin effect.). In this state, while a torque loaded to the rotating shaft was changed so as to reciprocate between positive and negative rated torques ($T_1$, $T_2$), the torque was measured to obtain characteristics data with respect to the torque measurement as illustrated in FIG. 6. From the characteristics data, sensitivity and hysteresis in torque measurement were obtained. Note that the sensitivity and the hysteresis were defined as follows:

Sensitivity (mV/Nm)=$\alpha/\gamma=|A_1-A_2|/|T_1-T_2|$

Hysteresis (% FS)=$\beta/\gamma=|a_1-a_2|/|T_1-T_2|$

Figure 7:
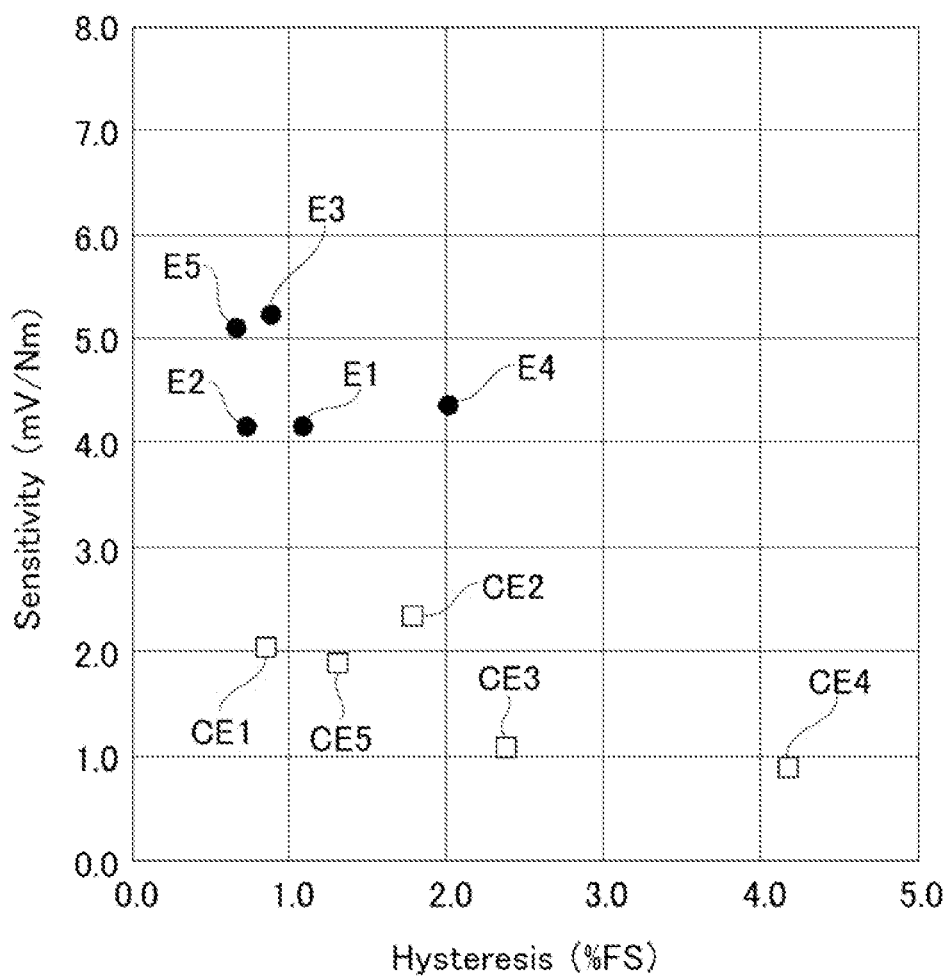
FIG. 7 is a graph illustrating sensitivity in torque measurement and hysteresis of examples of the present invention and comparative examples.

The sensitivity and hysteresis in torque measurement with respect to each rotating shaft (Examples 1 to 5, Comparative Examples 1 to 5) are shown in Table 2 and FIG. 7. Also in the graph of FIG. 7 and Table 2, Example is simply referred to as "E", and Comparative Example is simply referred to as "CE".

TABLE 2

|  | E1 | E2 | E3 | E4 | E5 | CE1 | CE2 | CE3 | CE4 | CE5 |
|---|---|---|---|---|---|---|---|---|---|---|
| Sensitivity (mV/Nm) | 4.19 | 4.17 | 5.26 | 4.40 | 5.13 | 2.04 | 2.34 | 1.05 | 0.94 | 1.90 |
| Hysteresis (% FS) | 1.10 | 0.74 | 0.89 | 2.02 | 0.68 | 0.86 | 1.79 | 2.37 | 4.13 | 1.32 |

[Consideration]

With reference to Table 2 and FIG. 7, the results of this experiment are considered.

Example 1, Example 2, Comparative Example 1, and Comparative Example 2 have the same heat treatment condition. These examples reveal that the sensitivity in torque measurement was more enhanced in the examples in which the shot peening was performed (Example 1, Example 2, Comparative Example 2) than in the example in which the shot peening was omitted (Comparative Example 1).

Example 3 and Comparative Example 3 have the same heat treatment condition. These examples also reveal that the sensitivity in torque measurement was more enhanced in the example in which the shot peening was performed (Example 3) than in the example in which the shot peening was omitted (Comparative Example 3).

Example 4, Example 5, Comparative Example 4, and Comparative Example 5 have the same heat treatment condition. These examples also reveal that the sensitivity in torque measurement was more enhanced in the examples in which the shot peening was performed (Example 4, Example 5, Comparative Example 5) than in the example in which the shot peening was omitted (Comparative Example 4).

The examples in which the shot peening was performed (Example 1 to Example 5, Comparative Example 2, Comparative Example 5) particularly reveal that the examples in which the arc height value was 0.31 mmA or more (Example 1 to Example 5) were able to suppress the hysteresis in torque measurement to be low (about 2.0% FS or less), and to effectively enhance the sensitivity in torque measurement.

REFERENCE SIGNS LIST

1 Rotating shaft
2 Rolling bearing
3 Torque sensor
4 Inner raceway
5 Detected surface
6 Outer ring
7 Needle
8 Retainer
9 Inward flange
10 Outer raceway
11 Sensor holder
12 Fitting cylinder portion
13 Back yoke
14 Detection part
15 First coil layer
16 Second coil layer
17 Third coil layer
18 Fourth coil layer
19 First detecting coil
20 Second detecting coil
21 Third detecting coil
22 Fourth detecting coil
23 Bridge circuit
24 Oscillator
25 Lock-in amplifier

The invention claimed is:

1. A torque load member, comprising:
a detected surface configured to face a magnetostrictive torque sensor, the detected surface having a cylindrical surface shape;
the detected surface being a shot peened surface whose magnetic anisotropy directed in a specific direction has been reduced by performing shot peening thereto at an arc height value of 0.31 mmA or more,
the torque load member having hysteresis of 2.0% FS or less, the hysteresis obtained by a characteristics data with respect to a torque measurement when a torque is measured while a torque loaded to the torque load member is changed so as to reciprocate between positive and negative rated torques.

2. A torque measuring device, comprising:
a torque load member having a detected surface; and
a magnetostrictive torque sensor facing the detected surface;
the torque load member being the torque load member described in claim 1.

3. The torque measuring device according to claim 2, comprising
a rolling bearing by which the torque load member is rotatably supported, and by which the torque sensor is supported.

4. A method for manufacturing a torque load member having a detected surface configured to face a magnetostrictive torque sensor, the detected surface having a cylindrical surface shape;
the method comprising:
a step of performing shot peening to the detected surface at an arc height value of 0.31 mmA or more so as to reduce magnetic anisotropy directed in a specific direction of the detected surface,
after the step of performing shot peening, the torque load member having hysteresis of 2.0% FS or less, the hysteresis obtained by a characteristics data with respect to a torque measurement when a torque is measured while a torque loaded to the torque load member is changed so as to reciprocate between positive and negative rated torques.

\* \* \* \* \*